(12) United States Patent
Urimoto et al.

(10) Patent No.: US 11,046,356 B2
(45) Date of Patent: Jun. 29, 2021

(54) ELECTRIC POWER STEERING DEVICE

(71) Applicant: Mitsubishi Electric Corporation, Tokyo (JP)

(72) Inventors: Kentaro Urimoto, Tokyo (JP); Tomohiko Nagashima, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 197 days.

(21) Appl. No.: 16/065,927

(22) PCT Filed: Mar. 14, 2016

(86) PCT No.: PCT/JP2016/057963
§ 371 (c)(1),
(2) Date: Jun. 25, 2018

(87) PCT Pub. No.: WO2017/158679
PCT Pub. Date: Sep. 21, 2017

(65) Prior Publication Data
US 2019/0016373 A1    Jan. 17, 2019

(51) Int. Cl.
*B62D 5/04*     (2006.01)
*B60R 16/03*    (2006.01)
(Continued)

(52) U.S. Cl.
CPC ............ *B62D 5/0406* (2013.01); *B60R 16/03* (2013.01); *B62D 5/04* (2013.01); *B62D 5/0463* (2013.01);
(Continued)

(58) Field of Classification Search
CPC ...... B62D 5/0406; B62D 5/04; B62D 5/0463; B60R 16/03; H01G 4/40; H03H 7/01;
(Continued)

(56) References Cited

U.S. PATENT DOCUMENTS

2014/0300304 A1* 10/2014 Omae .................. H02K 11/024
                                                        318/400.24
2016/0036304 A1*  2/2016 Yamasaki ........... B62D 5/0406
                                                            180/446
(Continued)

FOREIGN PATENT DOCUMENTS

JP        57-69324 U      4/1982
JP        3-286516 A     12/1991
(Continued)

OTHER PUBLICATIONS

Communication dated Aug. 27, 2019, from the Japanese Patent Office in counterpart Application No. 2018-505068.
(Continued)

*Primary Examiner* — Anne Marie M Boehler
*Assistant Examiner* — Felicia L. Brittman
(74) *Attorney, Agent, or Firm* — Sughrue Mion, PLLC; Richard C. Turner

(57) ABSTRACT

[Problem]
In an electric power steering device that includes a filter section, the electric power steering device in which a motor and a control unit are integrated with each other, a device that aims to improve the noise suppression function of the filter section and improve workability is provided.

[Solution]
In an electric power steering device that includes a filter section, the electric power steering device in which a motor and a control unit are integrated with each other, the control unit includes a filter module forming the filter section (Continued)

connected near a connector for power supply placed in an outermost portion, and this filter module is configured with wiring for electric conduction, coils and, and a filter substrate on which capacitors are mounted.

11 Claims, 6 Drawing Sheets

(51) Int. Cl.
    *H02K 11/33*     (2016.01)
    *H05K 5/00*     (2006.01)
    *H05K 7/14*     (2006.01)
    *H01F 27/00*     (2006.01)
    *H03H 7/01*     (2006.01)
    *H01G 4/40*     (2006.01)

(52) U.S. Cl.
    CPC ............... *H01F 27/00* (2013.01); *H01G 4/40* (2013.01); *H03H 7/01* (2013.01); *H02K 11/33* (2016.01); *H05K 5/0069* (2013.01); *H05K 7/1432* (2013.01)

(58) Field of Classification Search
    CPC .... H01F 27/00; H05K 7/1432; H05K 5/0069; H05K 11/33
    USPC ................................ 180/444; 310/71, 89, 67
    See application file for complete search history.

(56) References Cited

U.S. PATENT DOCUMENTS

2016/0072423 A1* 3/2016 Kanazawa ............... B62D 5/04
    180/444
2016/0174393 A1* 6/2016 Asao .................... H05K 7/1432
    180/443

FOREIGN PATENT DOCUMENTS

| JP | 06061054 A | 3/1994 |
| WO | 2013/132584 A1 | 9/2013 |
| WO | 2015/049791 A1 | 4/2015 |

OTHER PUBLICATIONS

International Search Report for PCT/JP2016/057963 dated May 31, 2016.
Communication dated Feb. 28, 2019 from the European Patent Office in application No. 16894303.3.
Communication dated May 6, 2020, from the State Intellectual Property Office of the P.R. of China in Application No. 201680083287.6.

* cited by examiner

ELECTRIC POWER STEERING DEVICE

CROSS REFERENCE TO RELATED APPLICATIONS

This application is a National Stage of International Application No. PCT/JP2016/057963 filed Mar. 14, 2016.

TECHNICAL FIELD

This invention relates to an electric power steering device that assists a driving force of a steering mechanism for a vehicle and, in particular, relates to improvement of a placement structure of a filter device in a device in which a motor and a control unit are integrated with each other.

BACKGROUND ART

In an existing electric steering device, an electric power steering device having a structure in which a motor including a stator winding and a control unit including an inverter circuit section that drives the stator winding are integrally formed coaxially on the counter-output side of a rotating shaft of the motor is already known (PTL 1).

CITATION LIST

Patent Literature

PTL 1: WO 2015/049791A1

SUMMARY OF INVENTION

Technical Problem

The device disclosed in PTL 1 is a device in which the control unit is placed on the counter-output side of the rotating shaft of the motor and a plurality of connectors and parts of a power supply circuit section (a filter circuit section) are mounted on the outside of a connector case covering the above-described control unit, the device which achieves miniaturization by separately placing the power supply circuit section without placing the power supply circuit section, which is a relatively large part, in the control unit. However, since the parts, such as a capacitor and a coil, of the power supply circuit section are connected by conductive bars for power supply which extend from connectors for power supply to the inside of the control unit, a plurality of through holes have to be formed in the connector case in advance, for example, which leaves room for further improvement of the workability of this portion.

Moreover, for example, the shape of the capacitor generally has a leg portion to be connected (welded) to the conductive bar; in actuality, a part having a shape without a leg portion, such as a ceramic capacitor, also exists, and, when such a part without a leg portion is used, connecting the part to the conductive bar is complicated in terms of work. Furthermore, since the distance of connection with the capacitor affects noise suppression, the shorter the connection distance, the better, and, since the connection path therebetween also affects noise suppression, there are quite a few points that have to be ingeniously improved.

This invention provides an electric power steering device that achieves further improvement of a noise suppression effect and improves workability by devising the configuration of a power supply circuit section (a filter circuit section).

Solution to Problem

In an electric power steering device that includes an electric motor rotating a steering mechanism for a vehicle and a control unit placed on the counter-output side of a rotating shaft of the motor, the electric power steering device in which a connector for power supply is placed in part of the control unit, near the connector for power supply in the control unit, a filter module into which filter parts including at least a bus bar for electric conduction, a coil, and a capacitor are integrated is housed.

Advantageous Effects of Invention

According to this invention, as described above, since, near a connector for power supply, a filter module into which filter parts including a bus bar for electric conduction, a coil, and a capacitor are integrated is housed in a control unit, the placement of a filter section and the ease with which the filter section is assembled are enhanced and wiring of the capacitor and the like can be shortened, which makes it possible to achieve further suppression of noise and miniaturization compared to an existing example.

DESCRIPTION OF EMBODIMENTS

Embodiment 1

Figure 1:
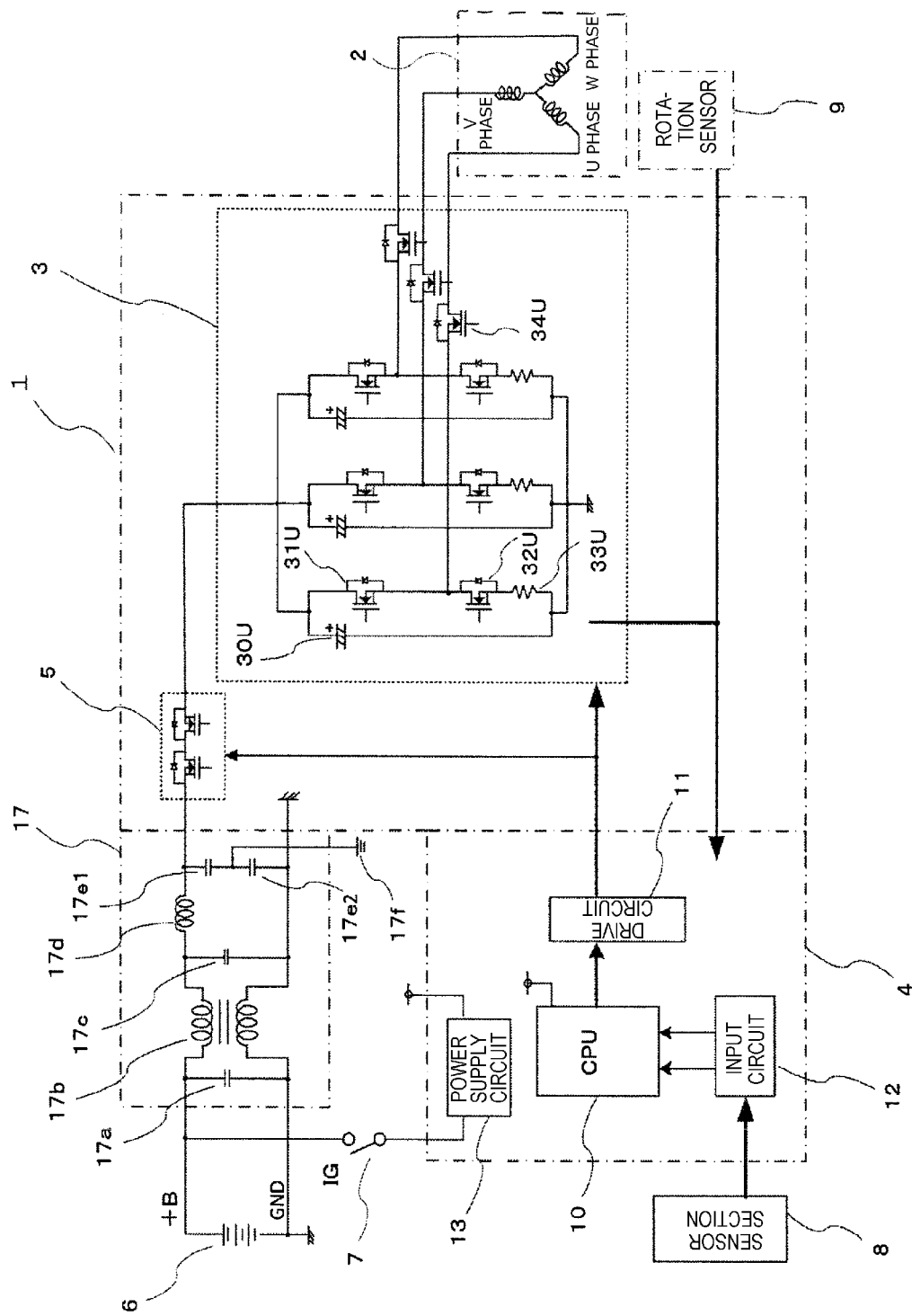
FIG. 1 is an overall circuit diagram of an electric power steering device to which this invention is directed.

Hereinafter, Embodiment 1 of this invention will be described based on the drawings. FIG. 1 is a circuit configuration diagram of the whole electric power steering device, and 1 denotes a control unit and 2 denotes a three-phase motor. The control unit 1 is mainly configured with a control circuit section 4 incorporating a CPU 10, an inverter circuit section 3 that supplies a current to the motor 2, a relay for power supply 5, and a filter section 17. A power supply +B (a battery power supply line) and CND (a ground line) are connected from a battery 6 mounted on a vehicle, and power is applied by an ignition switch 7 via a power supply circuit 13 of the control circuit section 4.

Furthermore, information of, for example, a torque sensor detecting steering torque, which is mounted near a steering mechanism (a handle) of the vehicle, a speed sensor detecting the traveling speed of the vehicle, and so forth is input from a sensor section 8. The power passing through the filter section 17, which is configured with a common mode coil 17b, a normal mode coil 17d, capacitors (17a, 17c, 17e1, 17e2), and so forth, is a current source of the inverter circuit section 3; however, depending on noise which the device generates, only one of the coils 17b and 17d may be provided and the number of capacitors can also be reduced.

The information from the sensor section 8 is transferred to the processing unit CPU 10 via an input circuit 12 of the control circuit section 4. From these information, the CPU 10 calculates a current value which is a controlled variable for rotating the motor 2 and outputs the current value. This output signal is transferred to a drive circuit 11 constituting an output circuit and to the inverter circuit section 3. Of the output circuit, the drive circuit 11 receives an instruction signal of the CPU 10 and outputs a drive signal that drives switching elements 31 and 32 of the inverter circuit section 3. Since only a small current flows through the drive circuit 11, the drive circuit 11 is placed in the control circuit section 1, but the drive circuit 11 can also be placed in the inverter circuit section 3. The inverter circuit section 3 is mainly configured with the switching elements 31 and 32 for upper and lower arms for three-phase windings (U V, W) of the motor 2, switching elements 34 for a motor relay, which connect or interrupt wiring between the switching elements 31 and 32 and the motor windings, shunt resistances 33 for current detection, and capacitors for noise suppression 30. The inverter circuit section 3 has the same circuit configuration for the windings of phases and can independently supply a current to the windings of phases.

Moreover, though not depicted in the drawing, a potential difference between the ends of each shunt resistance 33 and, for instance, a voltage of a motor winding terminal are also transferred to the input circuit 12. These information is also input to the CPU 10, and, by calculating a difference between the calculated current value and a corresponding detected value and performing so-called feedback control, the CPU 10 supplies a desired motor current and assists a steering force. Furthermore, the above-described drive circuit 11 also outputs a drive signal of a switching element 5 for a power supply relay, which operates as a relay that connects and interrupts the power supply of the battery +B and the inverter circuit section 3, and this switching element 5 makes it possible to interrupt the supply of a current to the motor itself. The switching elements 34 for a motor relay are also provided in the inverter circuit section 3 and can independently interrupt the phases under abnormal conditions of the phases. It is to be noted that the switching element 5 for a power supply relay may also be included in the inverter circuit section 3 because a large current flows through the switching element 5 for a power supply relay and heat generation occurs.

The CPU 10 has the abnormality detection function of detecting abnormalities of, in addition to the sensor section 8, the drive circuit 11, the inverter circuit section 3, the motor windings, and so forth based on each input information, and, when detecting an abnormal it in order to interrupt the current supply of only a predetermined phase, for example, in response to the abnormality, turns off the upper and lower switching elements 31 and 32 and the switching element 31 for a motor relay of the corresponding phase. Alternatively, it is also possible to turn off the switching element 5 for a power supply relay to interrupt the power supply itself.

The motor 2 is a brushless motor in which the three-phase windings are connected by delta connection. A rotation sensor 9 for detecting the rotation position of a rotor is mounted for the brushless motor, and the rotation information thereof is transferred to the input circuit 12 of the control circuit section 4. Instead of being a brushless motor with three-phase delta connection, the motor 2 may have star connection or may be a brush motor with two pairs of two poles. Moreover, as in the case of an existing device, distributed winding and concentrated winding can also be adopted as winding specifications.

Next, the details of the filter section 17 will be described. This filter section 17 is inserted to prevent noise by PWM control of the current of, in particular, the inverter circuit section 3 of the control unit 1 from being emitted to the outside from this device. The coil 17b is provided for noise between the lines of +B and GND and called a common mode coil, and the coil 17d is provided for noise of the +B line and called a normal mode coil. Moreover, of the capacitors, 17a and 17c are each called across the line or an X capacitor, and the capacitors 17e1 and 17e2 are each called a line bypass or a Y capacitor. The filter section 17 suppresses noise emitted by those filter elements and is called an electromagnetic interference (EMI) filter.

However, if the capacitor has a leg portion, for example, this is the equivalent of having inductance depending on the length of this leg portion and sometimes affects the effect of the filter due to the influence of residual inductance and equivalent series resistance. For this reason, the connection and placement thereof requires ingenuity; in general, a line that is connected to each element is designed so as to be as short as possible. Moreover, in order to make the length of wiring to the main bodies of, in particular, the capacitors 17a, 17c, 17e1, and 17e2 as short as possible, it is desirable to meet conductive lines themselves at capacitor connection positions, not laying out the conductive lines from the +B and GND lines to the capacitors. It is to be noted that a point 17f midway between the Y capacitors 17e1 and 17e2 is a body ground and connected, in an electrical sense, to a vehicle body (GND) via part of a main body of the motor 2.

The structure of integration of the motor 2 and the control unit 1 of the device having the above-described circuits will be described by using FIG. 2 and FIGS. 3A and 3B. Relatively large parts are present from the battery 6 to a control substrate 4a forming the control circuit section 4 via a connector 42 and the filter section 17 and the shapes thereof are also shapes which are not suitable for dense packaging, which hampers miniaturization. This invention is directed to improvement of the placement configuration of an area around the connector 42 and the filter section 17, which will be described in detail below.

Figure 2:
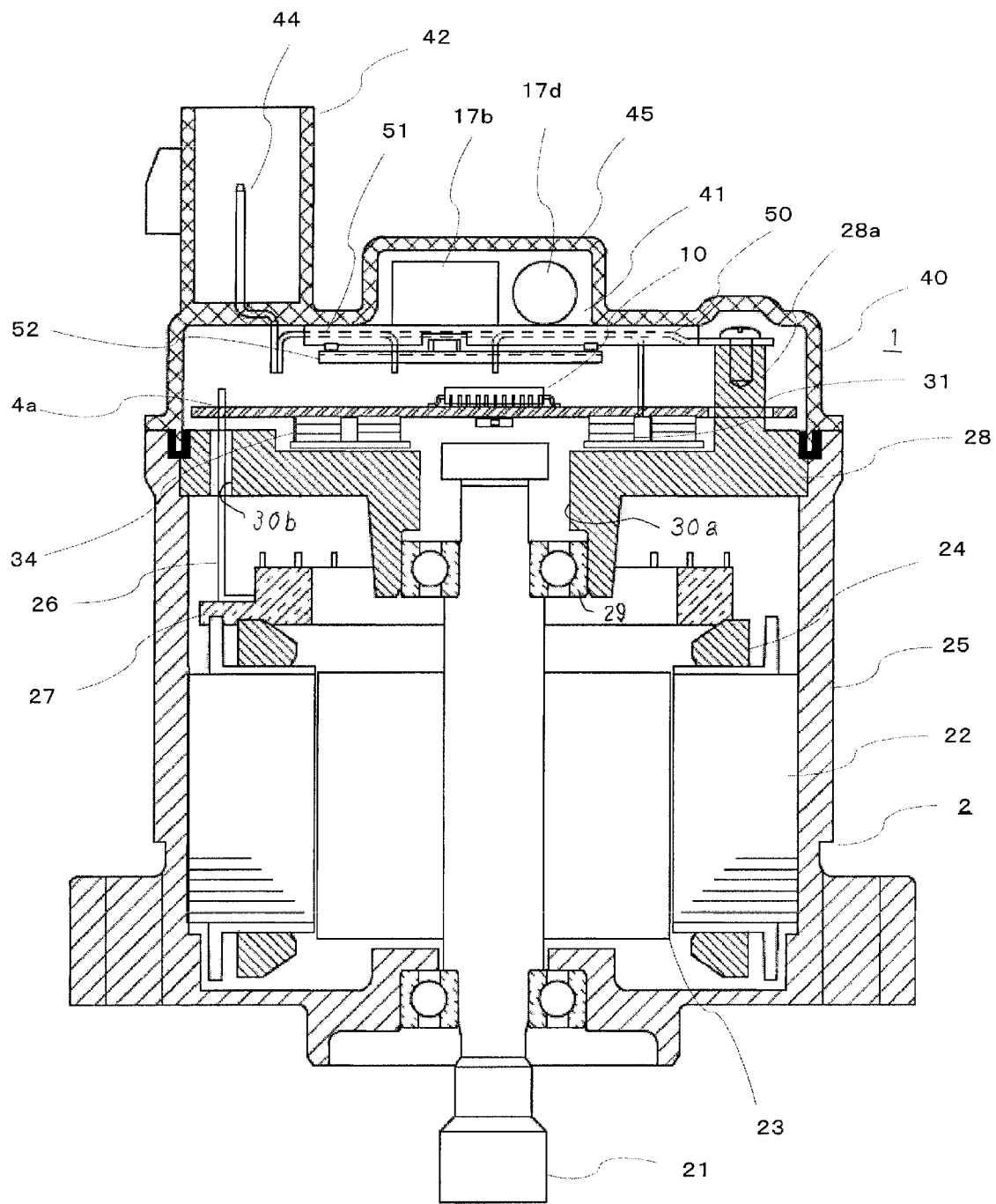
FIG. 2 is a sectional view depicting the overall configuration of an electric power steering device in Embodiment 1 of this invention.

FIG. 2 is a sectional view of the whole electric power steering device in Embodiment 1 of this invention; a lower side in the drawing is the motor 2 with an upper part with which the control unit 1 is integrated with a frame 28 interposed therebetween in such a way that the control unit 1 and a motor rotating shaft 21 are coaxially placed. The motor 2 is built into a motor case 25, and, in this motor case 25, as in the case of the existing device, around the rotating shaft 21, a rotor 23 formed of a plurality of pole pairs of permanent magnets is placed and a stator 22 around which windings 24 are wound is placed around the rotor 23 with a space left therebetween. The windings 24 of three phases are wound around the stator 22; as for an end of each phase, a ring-shaped connection ring 27 is disposed very near an upper part of the winding for connection, and, as for ends of the windings of three phases, winding ends 26 (only one of the three winding ends 26 is depicted in the drawing) which extend therefrom extend to the control unit 1. Moreover, at the boundary between the control unit 1 and the motor 2, the frame 28 is provided, and, in the center thereof, holes 30a through which a motor output shaft 21 passes with held a bearing 29, and 30*b* through which the winding ends 26 can pass and are provided.

The periphery of the control unit 1 is covered with a housing 40 coupled to the above-described motor case 25, roughly in the central part of the housing 40, a convex filter chamber 41 that houses the parts constituting the filter section 17 of FIG. 1 is present, and the control substrate 4*a* on which the control circuit section 4, which will be described later, and the like are mounted is built thereinto. In this control unit 1, in a periphery of the housing 40 near the filter chamber 41, a connector for power supply 42 is further placed. This connector for power supply 42 and the housing 40 (including an upper part 45 of the filter chamber 41) are integrally made of resin.

On the control substrate 4*a*, circuit parts such as the control circuit section 4 and the inverter circuit section 3 of FIG. 1 are mounted, and, in FIG. 2, the CPU 10 is mounted on the upper surface of the control substrate 4*a* and the switching elements 31 and 34 and the like are mounted on the lower surface of the control substrate 4*a*. Since the switching elements 31, 32, 34, and so forth, which supply a current to the coil windings of the motor 2, generate heat by the control, the switching elements 31, 32, 34, and so forth are configured so as to be in contact with the frame 28 so that the switching elements 31, 32, 34, and so forth can transfer heat thereto; therefore, the frame 28 also serves as a heat sink. Moreover, the coil winding ends 26 are connected to a wiring pattern or a terminal (none of which is depicted in the drawing) of the control substrate 4*a* and then connected to the switching elements of the inverter circuit section 3.

One of the features of this Embodiment 1 is that the filter section 17 incorporated into the filter chamber 41 is configured as a filter module into which the parts depicted in FIG. 1, that is, a plurality of bus bars 50 forming conductive lines, an insulating resin member 51, a filter substrate 52, the coils 17*b* and 17*d*, the capacitors 17*a*, 17*c*, 17*e*1, and 17*e*2, and so forth are integrated. Specifically, the bus bars 50, which are integrated with each other by the resin member 51, extend immediately below the filter chamber 41; one end of the bus bars 50 is electrically connected to an end extending from a terminal 44 (+B, GND) of the connector for power supply 42 and the other end is screw-held to a projection 28*a* of the frame 28. On these bus bars 50, the coils 17*b* and 17*d* are mounted as described above and electrical connection therebetween is also established.

Furthermore, below the above-described bus bars 50 and resin member 51, the filter substrate 52 is coupled, and, on this filter substrate 52, as will be described in detail later, wiring patterns are provided on the surface thereof and the capacitors 17*a*, 17*c*, 17*e*1, and 17*e*2 are mounted and electrical connection with the above-described wiring patterns is established. For instance, a plurality of bus bar pieces (not depicted in the drawing) extend from the above-described bus bars 50 toward the above-described wiring patterns and predetermined electrical connection is established. The filter substrate 52 and the bus bars 50 and the resin member 51 are integrated with each other by, for example, connecting the filter substrate 52 and the bus bars 50 and the resin member 51 by an added bus bar piece (not depicted in the drawing) or connecting the filter substrate 52 with the resin member 51 by a support column (not depicted in the drawing) projecting from the resin member 51.

Figure 3A:
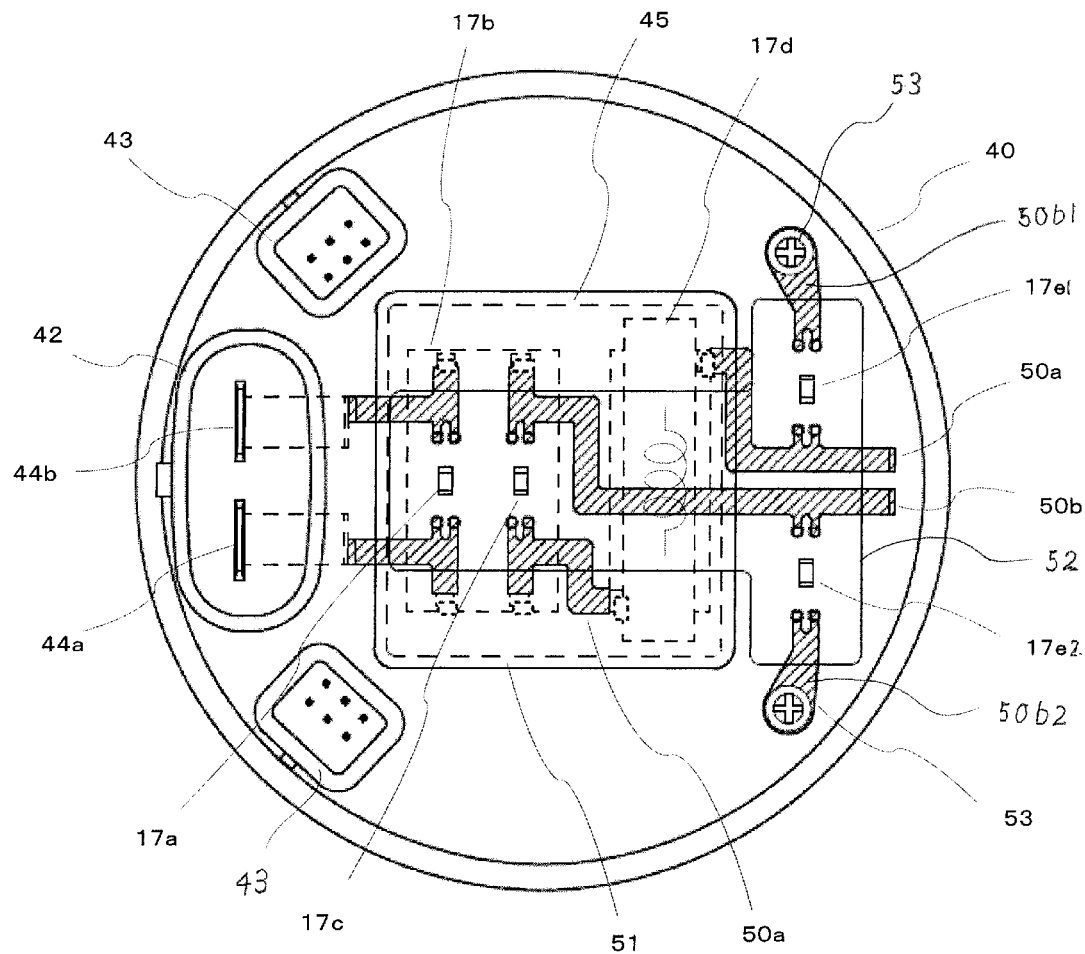
FIGS. 3A and 3B are top views depicting the internal configuration of an area around a filter module section in Embodiment 1 of this invention.

FIG. 3A is a diagram of the control unit 1 viewed from the outermost side and is a partially perspective view. FIG. 3B is a top view depicting only the filter substrate 52 removed therefrom. In the outermost portion inside the housing 40, the connector for power supply 42 is placed on one outer circumferential side and two terminals: the terminals +B 44*a* and GND 44*b* are provided to stand. These two terminals are connected to bus bars 50*a* and 50*b*, respectively, which are arranged in parallel and serve as conductive lines. Between the bus bars 50*a* and 50*b*, as depicted in the circuit diagram of FIG. 1, the coils 17*b* and 17*d* are provided and electrical connection is established. The leg portions of the coils 17*b* and 17*d* and part of each of the bus bars 50*a* and 50*b* are brought into contact with each other and connected by welding, for example (a first connection).

Figure 3B:
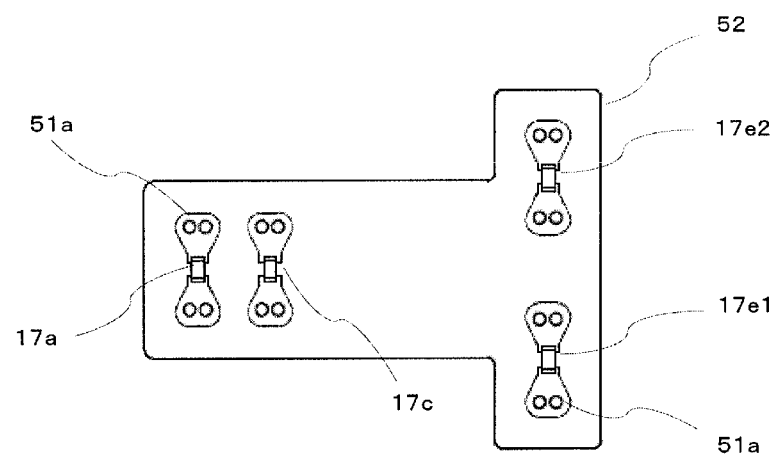

In the filter substrate 52 of FIG. 3B, a plurality of sets of two holes 51*a* arranged side by side, for example, are provided, and the bus bar pieces (not depicted in the drawing) extending from the bus bars 50*a* and 50*b* are inserted thereinto and connected to the wiring patterns of the filter substrate 52 by welding, for instance (a second connection). From this connection, the wiring patterns extend toward the capacitors 17*a*, 17*c*, 17*e*1, and 17*e*2 and are welded to the above-described capacitors. The capacitors 17*a* and 17*c* are located immediately below the coil 17*b*, and the above-described bus bar pieces form a connection with the above-described coil and are formed without being extended for a long distance from the main streams of the bus bars. As described above, as a result of the coil 17*b* placed on the above-described bus bars 50 and the capacitors 17*a* and 17*c* placed on the filter substrate 52 being connected as linearly as possible by the most direct way, it is possible to reduce residual inductance and equivalent series resistance to a minimum.

Next, a method for connecting the above-described capacitors 17*e*1 and 17*e*2 to the body ground will be described. As depicted in FIG. 3A, part of each of the bus bars 50 is extended (see 50*b*1 and 50*b*2 of FIG. 3A) and a fastening portion for a screw 53 is provided at an end thereof. Then, by fastening the above-described screws 53 and the ends of the above-described bus bars 50*b*1 and 50*b*2 to screw holes provided in the projection 28*a* of the frame 28 of FIG. 2, it is possible to connect the ends (intermediate connecting points) of the above-described capacitors 17*e*1 and 17*e*2 to 17*f* (GND) via the frame 28 of FIG. 2. The frame 28 is press-fit or swaged into the motor case 25, and the motor case 25 is attached to the vehicle body. Thus, the capacitors 17*e*1 and 17*e*2 are connected to the body ground by passing through each part.

As other parts, two sensor connectors 43 for the sensor section 8 are also placed on the periphery.

As described above, in Embodiment 1, since the filter section 17 is configured as a filter module into which the plurality of bus bars 50 serving as conductive lines, the insulating resin member 51, the filter substrate 52, the coils 17*b* and 17*d*, and the capacitors 17*a*, 17*c*, 17*e*1, and 17*e*2 are integrated and is housed and placed in the upper part of the control unit 1, the ease with which the filter section 17 is assembled is dramatically enhanced, and, since the use of the filter substrate 52 can make shorter the length of wiring from the bus bars 50, it is possible to perform the intrinsic noise suppression function of the filter sufficiently.

Embodiment 2

Figure 4:
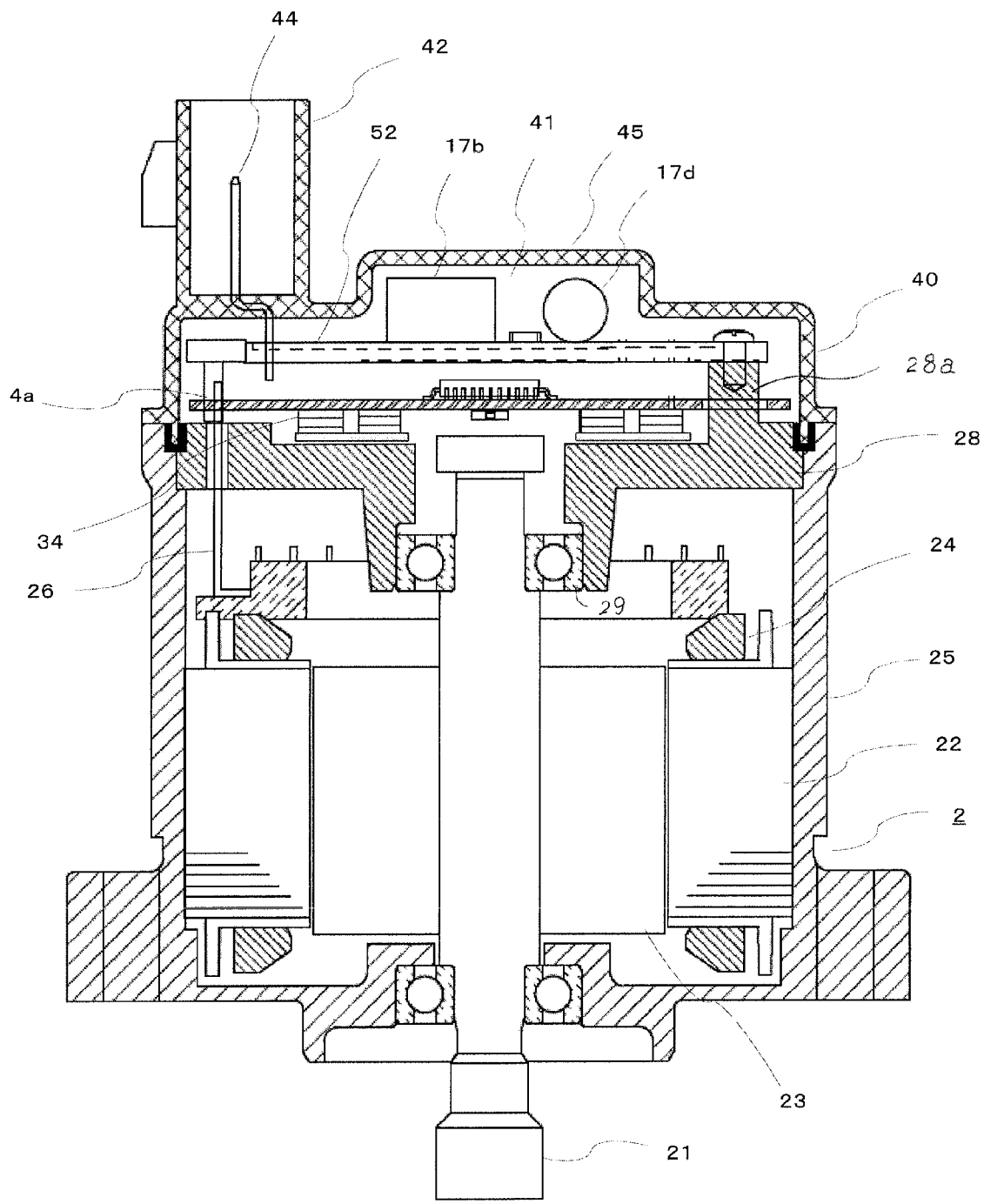
FIG. 4 is an overall configuration sectional view of an electric power steering device in Embodiment 2 of this invention.
Figure 5A:
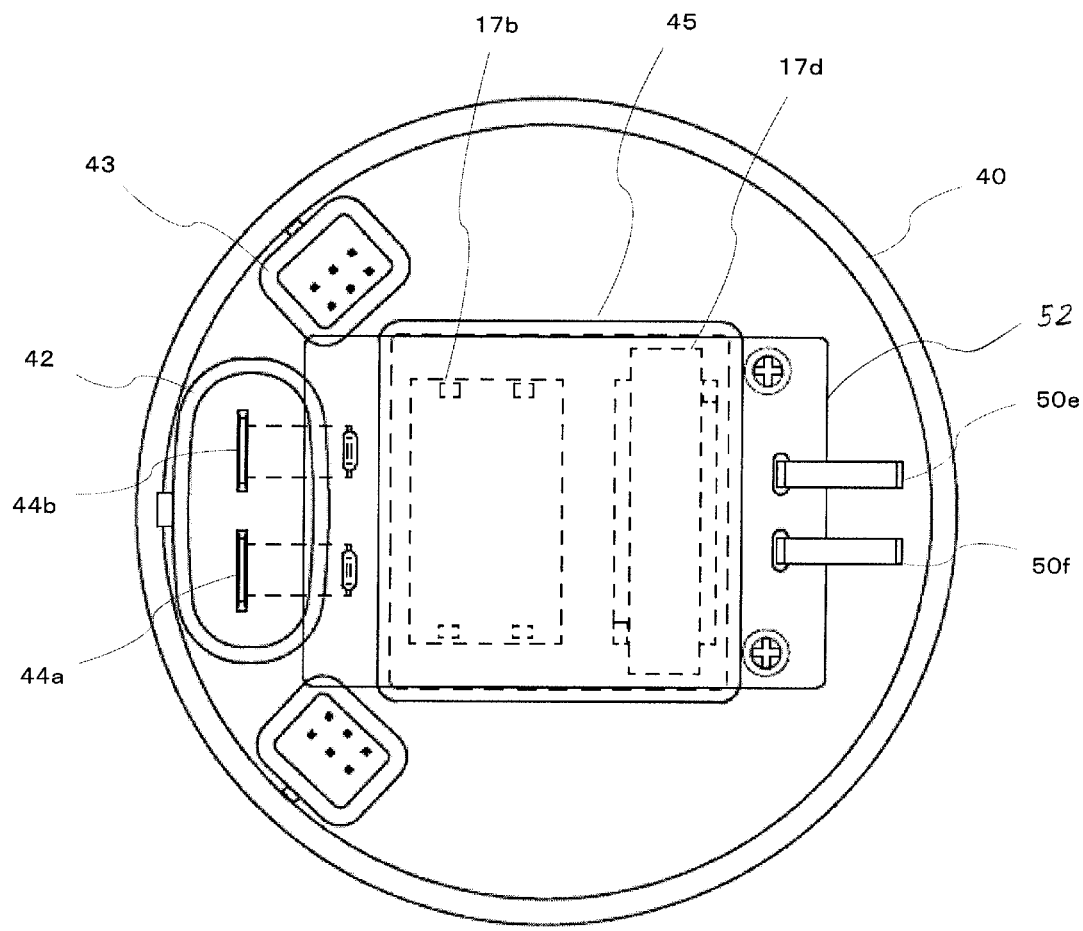
FIGS. 5A and 5B are top views depicting the internal configuration of an area around a filter module section in Embodiment 2 of this invention.
Figure 5B:
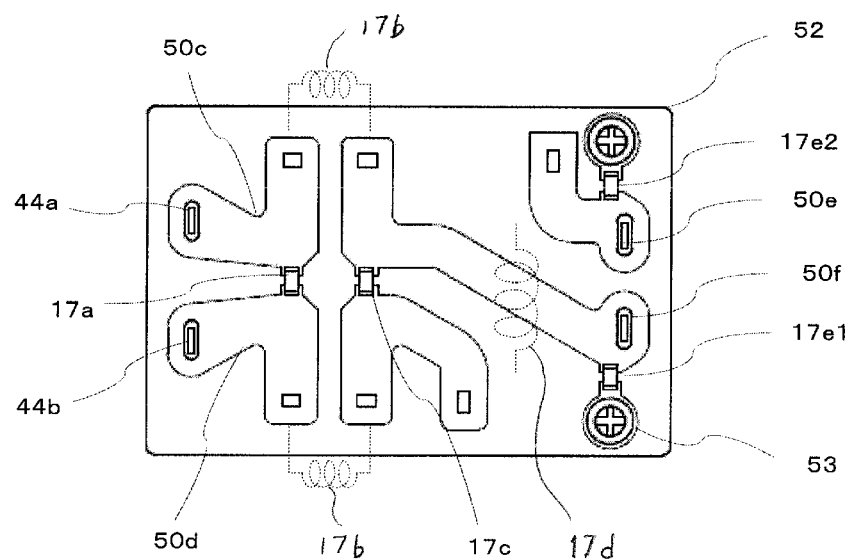

Next, Embodiment 2 will be described by using FIG. 4 and FIGS. 5A and 5B. Portions equivalent to those of Embodiment 1 are identified with the same reference signs. FIG. 4 is an overall configuration sectional view of an electric power steering device, and FIGS. 5A and 5B are top views depicting the internal configuration of an area around a filter module section. Since the configurations of the motor 2 and the control circuit 4 (the control substrate 4*a*) and the filter chamber 41 of the housing 40 of the control unit 1 are the same as those of Embodiment 1, explanations thereof will be omitted. Since Embodiment 2 differs from Embodiment 1 in the configuration of a filter module forming the filter section 17, this portion will be described below. The bus bars 50 forming the conductive lines and the insulating resin member 51 of Embodiment 1 are omitted and wiring patterns placed on the surface of the filter substrate 52 are substituted therefor. One end of this filter substrate 52 is supported by the frame 28 and the other end is screw-held to the projection 28*a* of the frame 28.

Furthermore, an extension of the terminal 44 of the connector for power supply 42 passes through the wiring patterns formed on the surface of the filter substrate 52 and is connected thereto by welding, for example. It is to be noted that the coils 17*b* and 17*d* and the capacitors are mounted on the filter substrate 52 and electrical connection therebetween is also established.

In addition, the detailed configuration of the filter module will be described with reference to FIGS. 5A and 5B. As mentioned above, the terminals 44*a* and 44*b* of the connector for power supply 42 extend to the inside of the control unit 1 and pass through the filter substrate 52 (FIG. 5A) and are connected to the wiring patterns (50*c*, 50*d*) on the surface of the filter substrate 52 by welding, for example. As is clear from FIG. 5B, the wiring patterns 50*c* and 50*d* each have a plurality of virtually V-shaped patterns and are formed so as to extend in a symmetric manner and be connectable to the capacitor 17*a* and the coil 17*b*. The wiring patterns 50*c* and 50*d* are formed so as to be then connected to the capacitor 17*c*, the coil 17*d*, and the capacitors 17*e*1 and 17*e*2 and finally connected to terminals 50*e* and 50*f*. Though not depicted in the drawings, these terminals 50*e* and 50*f* are provided to supply power to the control substrate 4*a* of FIG. 4.

As described above, the filter module is configured by forming a base of the filter section 17 by using the filter substrate 52 and the wiring patterns 50*c* and 50*d* provided thereon and placing and connecting the electrical parts thereon and thereto, and the ease with which the filter section 17 is assembled is further enhanced. Moreover, from the connector terminals 44*a* and 44*b*, the wiring patterns 50*c* and 50*d* are each connected first to the capacitor 17*a* on one side, that is, a bent portion of the virtually V-shaped pattern and then connected to the coil 17*b* at an end of another side connecting to the bent portion; thus, since a configuration in which the capacitor 17*a* is connected only to the bent portion of the V-shaped pattern, not the main stream (total length) of the wiring pattern, is adopted, it is possible to shorten a conductive path to the capacitor and further reduce residual inductance. It is to be noted there is no need to give much consideration to inductance in distance length from the terminals 44*a* and 44*b* to the coil 17*b*. The reason is that a coil having inductance as inserted in series, and a slight increase in inductance in a wiring pattern causes no problem. Furthermore, the patterns 50*c* and 50*d* are placed in a nearly symmetric manner, so that the distances of connection to the +B line and the GND line become the same length.

Although the wiring patterns 50*c* and 50*d* of the filter substrate 52 are placed on one surface of the substrate as depicted in FIG. 5B, another pattern can be placed on the other surface of the filter substrate 52 and the other pattern on the other surface can also be brought into contact with the body ground by a connecting member, for example, the screw 53. By placing a power supply wiring pattern on one surface and a body ground pattern on the other surface by using the surfaces of the filter substrate 52, it is also possible to cut off emitted noise from the control substrate 4*a*. Moreover, as for holding of large parts such as the coils 17*b* and 17*d*, in addition to attaching a holding member to the filter substrate 52, a structure in which a part is provided with a leg in an outside diameter portion thereof and a hole into which the leg portion can be inserted is formed in the filter substrate 52 for positioning and holding can also be adopted.

As described above, since a filter module is configured by using the wiring pattern on the filter substrate 52 as a conductive line, the effects of enhancing the ease with which the filter section 17 is assembled and achieving weight reduction by reducing the number of bus bar parts are obtained.

Embodiment 3

Figure 6:
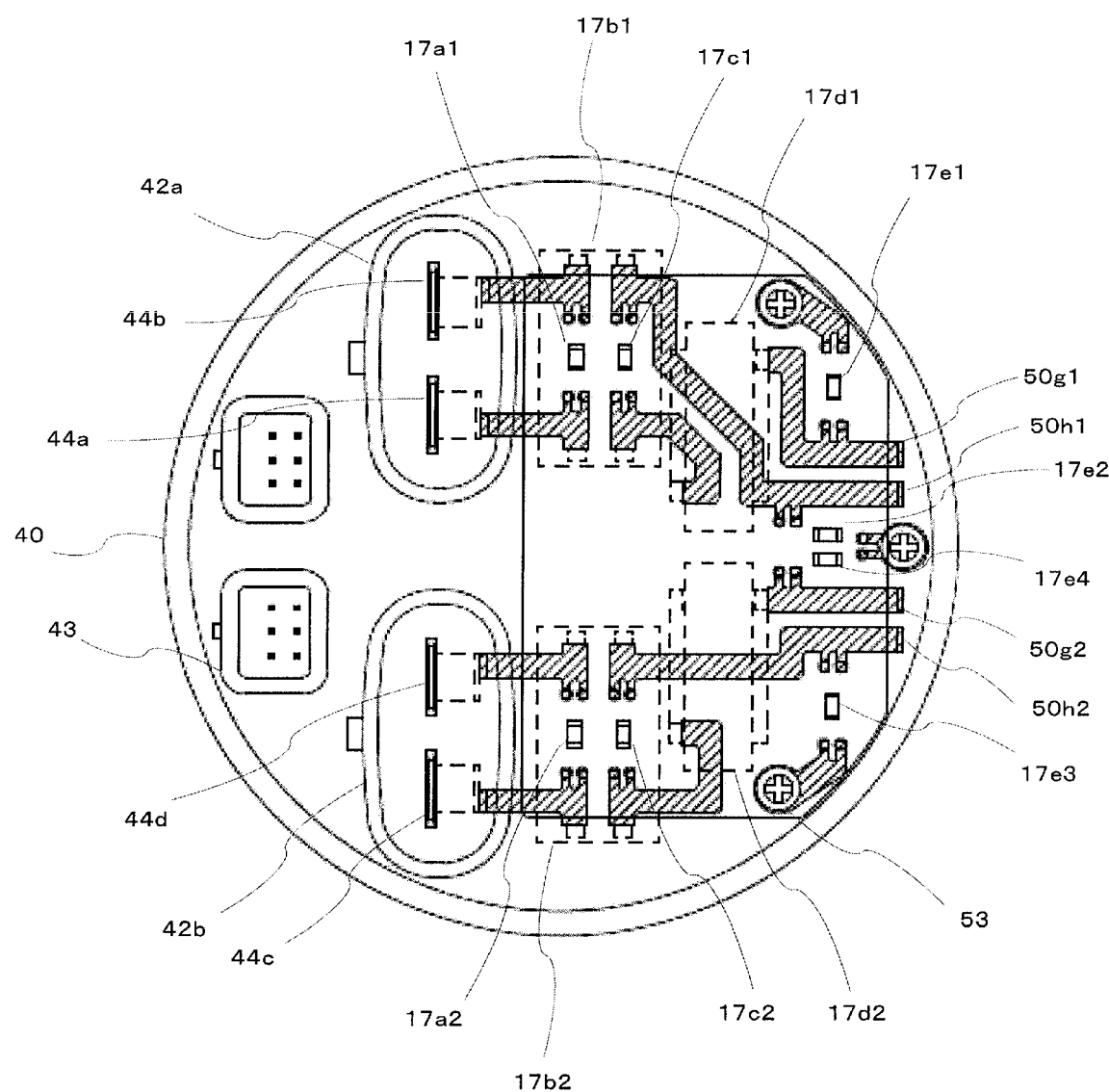
FIG. 6 is an internal configuration diagram of an area around a filter module section in Embodiment 3 of this invention.

Next, Embodiment 3 will be described. FIG. 6 is a top view of a housing 40 of a control unit 1, and what is different from Embodiments 1 and 2 is that two connectors for power supply are placed and two filter sections connecting thereto are also independently placed. What is dealt with is a device having a configuration in which, in the circuit of FIG. 1, two sets of winding sets of a motor 2 are present and therefore two sets of inverter circuits are provided therefor. In order to supply a large current to such a device provided with the two sets of motor windings and the two sets of inverter circuits, two sets of connectors for power supply of input, and two sets of filter sections are provided. As depicted in FIG. 6, connectors for power supply 42*a* and 42*b* are arranged in parallel, and +B and GND terminals 44*a* and 44*b* of the connector for power supply 42*a* and +B and GND terminals 44*c* and 44*d* of the connector for power supply 42*b* respectively extend and are connected to a common mode coil 17*b*1 and capacitors 17*a*1 and 17*c*1 and a common mode coil 17*b*2 and capacitors 17*a*2 and 17*c*2.

Since normal mode coils 17*d*1 and 17*d*2 use exactly the same elements, as a result of being placed and connected as depicted in FIG. 6, bus bars 50*g*1, 50*h*1, 50*g*2, and 50*h*2 forming the output terminals thereof are placed in the order of +, −, +, and −. As described above, even in a device provided with two sets of connectors and two sets of filter sections, both parts are placed in parallel and the filter sections are integrated with each other and the elements are similarly placed and connected in a symmetric manner. If the coil windings of the normal mode coils 17*d*1 and 17*d*2 are changed and the positions of the leads thereof are changed, the order of placement of the bus bars of the output terminals is +(50*g*1), −(50*h*1), −(50*h*2), and +(50*g*2). A determination as to which of the orders of placement of the bus bars is used may be made with consideration given to standardization of parts, wiring between the control substrate 4*a* and the inverter circuit 3, and so forth.

By integrating even two sets of + and − terminals with each other by one insulating resin member and, in addition thereto, configuring a filter substrate on which capacitors are mounted as one substrate, modularization can be achieved. Furthermore, a connector 43 for a sensor is placed in an outer circumferential position that does not interfere with the connector for power supply 42 and the filter section 17. This offers advantages of, not only the efficient placement on the upper surface of the housing 40, but also the separate placement of wiring in the control unit, such that wiring can be performed for a sensor section from the left side of FIG. 6 and for a power supply system from the right side.

Moreover, connection to a body ground is established by using a screw 53. However, since Y capacitors 17e2 and 17e4 are located close to each other, connection is shared thereby.

As described above, even with a device provided with two connectors for power supply and two filter sections, by placing and connecting the connectors for power supply and the filter sections in a nearly parallel manner on the upper surface of the housing 40, miniaturization and enhancement in workability can be achieved, and, by configuring the filter section 17 as a module having two sets of each of elements, the ease with which the filter section 17 is mounted and enhancement of placement thereof are achieved.

REFERENCE SIGNS LIST 1 control unit, 2 motor, 3 inverter circuit section, circuit control section, 4a control substrate, 5 relay for power supply, 6 battery, 8 sensor section, 9 rotation sensor, 10 CPU, 11 drive circuit, 12 input circuit, 13 power supply circuit, 17 filter section, 17a, 17c, 17e capacitor, 17b, 17d coil, 21 motor shaft, 22 motor, 24 winding, 25 motor case, 26 winding end, 27 connection ring, frame, 28a projection, 40 housing, 41 filter chamber, power supply connector, 44 power supply terminal, 50a, 50b, 50e, 50f, 50g, 50h bus bar (conductive line), 50c, 50d wiring pattern (conductive line), 51 resin member, 52 filter substrate, 53 screw

The invention claimed is:

1. An electric power steering device comprising:
an electric motor rotating a steering mechanism for a vehicle;
an inverter; and
a control unit placed on a counter-output side of a rotating shaft of the electric motor, the control unit comprising a central processing unit (CPU),
wherein a connector for power supply is placed in part of the control unit, and wherein the electric power steering device includes a filter module comprising filter parts in which at least wiring for electric conduction, a coil, and a capacitor are housed near the connector for power supply in the control unit, and
wherein the at least wiring for electric conduction, the coil, and the capacitor are configured near the connector for power supply in the control unit at least in part by placement of the capacitor between the connector for power supply and the CPU of the control unit, thereby suppressing a leakage of a pulse-width-modulation (PWM) current noise from the inverter toward the control unit.

2. The electric power steering device according to claim 1, wherein
the wiring for electric conduction includes a + line and a − line for power supply which are placed in parallel,
the coil is provided with at least one of a common mode coil and a normal mode coil,
the capacitor is placed near the coil, and
an area of connection between a main stream portion of the wiring for electric conduction and the coil and an area of connection between the main stream portion of the wiring for electric conduction and the capacitor are wired in a shortest distance.

3. The electric power steering device according to claim 2, wherein
the capacitor is placed immediately below the coil.

4. The electric power steering device according to claim 1, wherein
the capacitor is placed immediately below the coil.

5. The electric power steering device of claim 1, wherein the capacitor is a ceramic capacitor, and a terminal of the capacitor is welded directly to a wiring pattern of a circuit substrate.

6. The electric power steering device of claim 1, wherein the capacitor is a ceramic capacitor, a terminal of the capacitor is welded directly to a wiring pattern of a circuit substrate, and the capacitor and the coil are mounted on opposite sides of the circuit substrate.

7. An electric power steering device comprising:
an electric motor rotating a steering mechanism for a vehicle; and
a control unit placed on a counter-output side of a rotating shaft of the electric motor,
wherein a connector for power supply is placed in part of the control unit, and the electric power steering device includes a filter module comprising filter parts in which at least wiring for electric conduction, a coil, and a capacitor are integrated, wherein the filter module is housed near the connector for power supply in the control unit,
wherein the filter module is configured with a plate-shaped bus bar that is held by an insulating resin member and has one surface on which the coil is mounted and a filter substrate on which the capacitor is mounted, the filter substrate is integrated with the plate-shaped bus bar and the insulating resin member, and
wherein the plate-shaped bus bar includes a first connection that is connected to the coil and a second connection that is connected to the capacitor mounted on the filter substrate.

8. The electric power steering device according to claim 7, wherein
in a configuration in which a plurality of sets of the connectors for power supply and a plurality of sets of filter sections are placed in parallel, the connectors for power supply are integrated with each other by one insulating resin member and the filter sections are mounted on one filter substrate.

9. An electric power steering device comprising:
an electric motor rotating a steering mechanism for a vehicle; and
a control unit placed on a counter-output side of a rotating shaft of the electric motor,
wherein a connector for power supply is placed in part of the control unit, and the electric power steering device includes a filter module comprising filter parts in which at least wiring for electric conduction, a coil, and a capacitor are integrated is housed near the connector for power supply in the control unit,
wherein the filter module is configured with a filter substrate having one surface on which the coil is mounted and another surface on which the capacitor is mounted, and
wherein the filter substrate has a surface on which a pattern for wiring is formed and includes, in the pattern for wiring, a connection to which the coil and the capacitor are electrically connected.

10. The electric power steering device according to claim 9, wherein
the pattern for wiring is formed in a shape of a letter V and, to a bent portion of the shape of the letter V, the capacitor is connected.

11. An electric power steering device comprising:
an electric motor rotating a steering mechanism for a vehicle; and
a control unit placed on a counter-output side of a rotating shaft of the electric motor;
wherein a connector for power supply is placed in part of the control unit, and wherein the electric power steering device includes a filter module comprising filter parts in which at least wiring for electric conduction, a coil, and a capacitor are integrated, wherein the filter module is housed near the connector for power supply in the control unit,
wherein in part of the wiring for electric conduction, a body ground pattern which is electrically connected to a case of the electric motor is provided,
and wherein
the electric motor includes a frame forming a boundary with the control unit,
the frame is brought into electric contact with the case of the electric motor, and
the body ground pattern is electrically and mechanically connected to part of the frame.

\* \* \* \* \*